(12) United States Patent
Chien et al.

(10) Patent No.: US 9,640,456 B2
(45) Date of Patent: May 2, 2017

(54) SUPPORT STRUCTURE FOR INTEGRATED CIRCUITRY

(71) Applicant: Taiwan Semiconductor Manufacturing Company Limited, Hsin-Chu (TW)

(72) Inventors: Volume Chien, Sinying (TW); Yun-Wei Cheng, Taipei (TW); I-I Cheng, Tainan (TW); Shiu-Ko JangJian, Tainan (TW); Chi-Cherng Jeng, Madou Township (TW); Chih-Mu Huang, Tainan (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 249 days.

(21) Appl. No.: 13/893,652

(22) Filed: May 14, 2013

(65) Prior Publication Data

US 2014/0268609 A1 Sep. 18, 2014

Related U.S. Application Data

(60) Provisional application No. 61/798,793, filed on Mar. 15, 2013.

(51) Int. Cl.
*H05K 1/18* (2006.01)
*H01L 23/31* (2006.01)
(Continued)

(52) U.S. Cl.
CPC ...... *H01L 23/3121* (2013.01); *H01L 23/3192* (2013.01); *H01L 23/562* (2013.01);
(Continued)

(58) Field of Classification Search
CPC ............ H01L 23/3121; H01L 23/3192; H01L 23/562; H01L 23/585; H01L 27/14634
(Continued)

(56) References Cited

U.S. PATENT DOCUMENTS

| 6,215,164 B1 * | 4/2001 | Cao | H01L 27/14603 257/430 |
| 2007/0004193 A1 * | 1/2007 | Wu | H01L 21/76808 438/624 |

(Continued)

FOREIGN PATENT DOCUMENTS

CN 102842597 A 12/2012

OTHER PUBLICATIONS

Corresponding Chinese Application: 201410006691.6, Chinese Office action dated May 5, 2016, 8 pages.

*Primary Examiner* — Yuriy Semenenko
(74) *Attorney, Agent, or Firm* — Cooper Legal Group, LLC (57) ABSTRACT

Among other things, one or more support structures for integrated circuitry and techniques for forming such support structures are provided. A support structure comprises one or more trench structures, such as a first trench structure and a second trench structure formed around a periphery of integrated circuitry. In some embodiments, one or more trench structures are formed according to partial substrate etching, such that respective trench structures are formed into a region of a substrate. In some embodiments, one or more trench structures are formed according to discontinued substrate etching, such that respective trench structures comprise one or more trench portions separated by separation regions of the substrate. The support structure mitigates (Continued)

stress energy from reaching the integrated circuitry, and facilitates process-induced charge release from the integrated circuitry.

20 Claims, 5 Drawing Sheets

(51) Int. Cl.
    *H01L 23/58*      (2006.01)
    *H01L 23/00*      (2006.01)
    *H01L 27/146*      (2006.01)

(52) U.S. Cl.
    CPC ...... *H01L 23/585* (2013.01); *H01L 27/14634* (2013.01); *H01L 2924/0002* (2013.01)

(58) Field of Classification Search
    USPC .......................................... 361/760, 764, 767
    See application file for complete search history.

(56) References Cited

U.S. PATENT DOCUMENTS

| | | | |
|---|---|---|---|
| 2008/0079085 A1* | 4/2008 | Schwan et al. | 257/369 |
| 2008/0296774 A1* | 12/2008 | Kellner-Werdehausen et al. | 257/773 |
| 2009/0127652 A1* | 5/2009 | Ding ............ H01L 21/76 | 257/508 |
| 2012/0202327 A1* | 8/2012 | Lehnert et al. | 438/270 |
| 2012/0319296 A1* | 12/2012 | Tsumura ........ H01L 23/562 | 257/774 |
| 2013/0075760 A1* | 3/2013 | Takaya et al. | 257/77 |
| 2015/0008555 A1* | 1/2015 | Mizuta et al. | 257/432 |

\* cited by examiner

SUPPORT STRUCTURE FOR INTEGRATED CIRCUITRY

BACKGROUND

During fabrication of an integrated circuit on a semiconductor wafer, various processing techniques are performed, such as formation of one or more layers, etching of unwanted material, chemical mechanical polishing to remove excess material or smooth a surface of the semiconductor wafer, cutting of the semiconductor wafer to separate respective integrated circuitry from thereon, or other processing techniques. Such processing techniques can result in stress, such as mechanical stress from cutting the semiconductor wafer, on integrated circuitry that can result in cracking or other damage to the integrated circuitry. Process-induced charge can degrade performance of the integrated circuitry.

DETAILED DESCRIPTION

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

One or more integrated circuits can be formed on a semiconductor wafer. For example, the semiconductor wafer can comprise a first integrated circuit comprising a first image sensor, a second integrated circuit, formed adjacent to the first integrated circuit, comprising a second image sensor, or other integrated circuitry. The first image sensor can comprise a pixel array, a black level calibration region, a pad, or other devices. Fabrication of the integrated circuitry on the semiconductor wafer can induce stress upon at least some of the semiconductor wafer within which at least some of the integrated circuitry is formed. For example, during a dicing process where the semiconductor wafer is cut to separate integrated circuitry from other integrated circuitry, stress energy can damage the integrated circuitry, such as by creating cracks within the semiconductor wafer within which at least some of the integrated circuitry is formed. Additionally, process-induced charge can reduce performance of the integrated circuitry. Accordingly, as provided herein, a support structure comprising one or more trench structures is formed for the integrated circuitry. For example, the support structure comprises a first trench structure formed as a first ring around a periphery of the integrated circuitry. The support structure comprises a second trench structure formed as a second ring, concentric with the first ring, around the periphery of the integrated circuitry. The first trench structure and the second trench structure are formed such that stress is blocked or redirected by either the first trench structure, the second trench structure or both the first trench structure and the second trench structure, while still allowing process-induced charge to be released from the integrated circuitry through a remaining portion of a substrate within which the support structure is formed.

Figure 1:
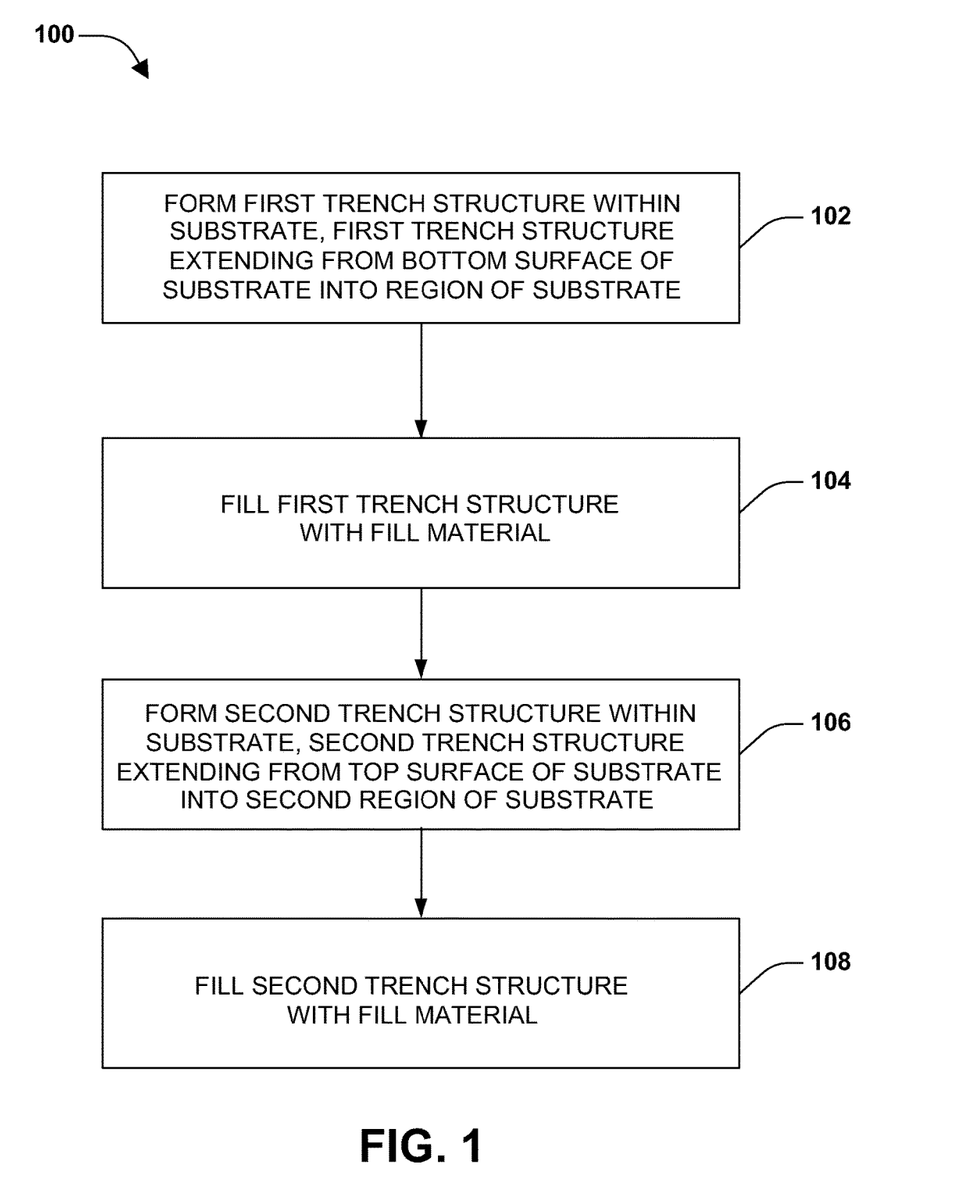
FIG. 1 is a flow diagram illustrating a method of forming a support structure for integrated circuitry, according to some embodiments.
Figure 2A:
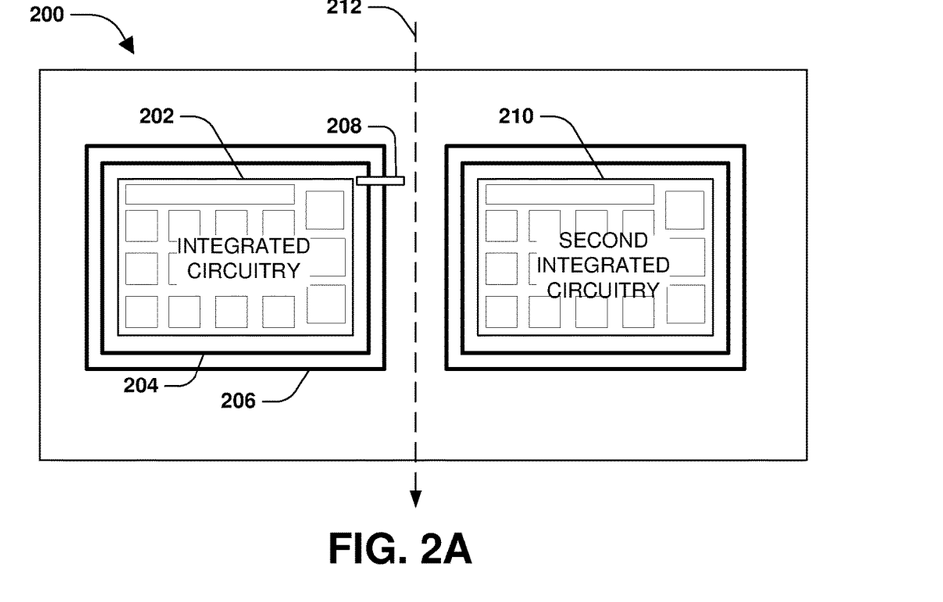
FIG. 2A is an illustration of a support structure, according to some embodiments.
Figure 2B:
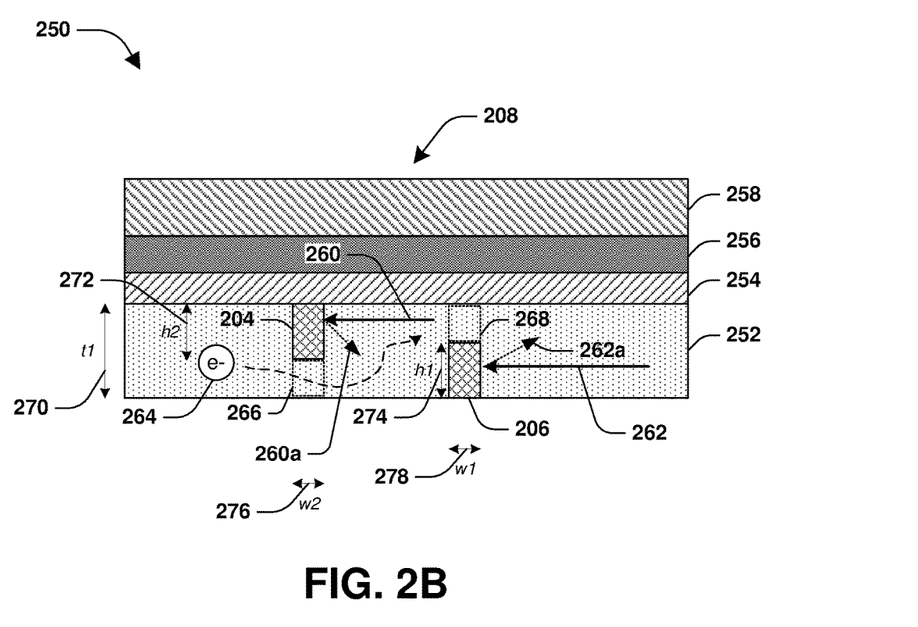
FIG. 2B is an illustration of a cross-sectional view of a support structure taken along line 208 of FIG. 2A, according to some embodiments.

A method 100 of forming a support structure for integrated circuitry 202, according to some embodiments, is illustrated in FIG. 1, and one or more support structures formed by such a methodology are illustrated in FIGS. 2A-2B. In an example, a semiconductor wafer comprises integrated circuitry 202 and second integrated circuitry 210, as illustrated in example 200 of FIG. 2A. A support structure comprising one or more trench structures, such as a first trench structure 206 and a second trench structure 204, is formed in order to mitigate stress (e.g., stress energy 260 and stress energy 262) on the integrated circuitry 202, such as due to a dicing process 212 that separates the integrated circuitry 202 from the second integrated circuitry 210. The support structure is formed such that process-induced charge 264 is capable of releasing from the integrated circuitry 202 through a remaining portion of a substrate within which the support structure is formed, as illustrated in example 250 of FIG. 2B corresponding to cross-sectional view taken along line 208 of FIG. 2A.

At 102, the first trench structure 206 is formed within a substrate 252 of the semiconductor wafer, such as a silicon substrate. In some embodiments, a thickness (t1) 270 of the substrate 252 is between about 0.5 μm and about 5 μm. In some embodiments, the first trench structure 206 is formed while a first side of the semiconductor wafer is exposed. In some embodiments, a scribe line etching process is utilized to form the first trench structure 206. In some embodiments, a dry etching process is utilized to form the first trench structure 206. For example, a silicon dry etch process is used where the substrate 252 comprises a silicon material. In some embodiments, a width (w1) 278 of the first trench structure 206 is between about 5 μm and about 200 μm, as measured from left to right on the page. In some embodiments, a height (h1) 274 of the first trench structure 206 is between about 50% and about 90% of the thickness (t1) 270 of the substrate 252. The first trench structure 206 extends from a bottom surface of the substrate 252 into a region of the substrate 252, such that a substrate portion 268 remains between a top surface of the substrate 252 and a top surface of the first trench structure 206. In this way, the process-induced charge 264 can be released from the integrated circuitry 202 by traveling through the substrate portion 268, as illustrated in example 250 of FIG. 2B. At 104, the first trench structure 206 is filled with a fill material that is different than a material of the substrate 252. In some embodiments, the fill material comprises ambient air or oxygen such that no additional material is formed in the first trench structure 206. That is, although first trench 'structure' 206 is used herein, such a 'structure' comprises an opening in the substrate 252 in some embodiments. In some embodiments, the fill material comprises a dielectric material, or other material. For example, the fill material comprises silicon oxide (SiO), silicon nitride (SiN), silicon dioxide ($SiO_2$), or other dielectric material. In some embodiments, the first trench structure 206 has a substantially vertical profile, which can facilitate blocking or redirecting of stress energy 262. That is, an interface between the fill material of the first trench structure 206 and the substrate 252 is capable of blocking or redirecting stress energy 262 away from the integrated circuitry 202 because the substrate 252 comprises a different material than the first trench structure 206, as illustrated in example 250 of FIG. 2B.

In an example, the substrate 252 comprises a silicon material and the first trench structure 206 comprises a fill material different than the silicon material of the substrate 252, such that when stress energy 262, traveling through the substrate 252, encounters the interface between the different materials, the stress energy 262 continues propagating (stress energy redirection 262a) within the substrate 252 (e.g., by changing directions within the substrate 252) as opposed to penetrating the first trench structure 206, which comprises a different material than the substrate 252. For example, the stress energy 262 changes a direction (stress energy redirection 262a) so that the stress energy 262 continues propagating within the substrate 252 as opposed to penetrating into the fill material of the first trench structure 206. In this way, stress energy, such as stress energy resulting from cutting or dicing the semiconductor wafer is mitigated based upon a difference in material type between the substrate 252 and the first trench structure 206. It will be appreciate that this remains true where first trench structure 206 is filled with ambient air and thus comprises an opening in the substrate 252.

At 106, the second trench structure 204 is formed within the substrate 252 of the semiconductor wafer. In some embodiments, after the first trench structure 206 is formed and filled, the semiconductor wafer is rotated, such as flipped, from the first side to a second side for formation and filling of the second trench structure 204. For example, a second etch is performed to form the second trench structure 204. In some embodiments, the second trench structure 204 is formed in a manner similar to that used to form the first trench structure 206, such as using the scribe line etching process. In some embodiments, a width (w2) 276 of the second trench structure 204 is between about 5 µm and about 200 µm, as measured from left to right on the page. In some embodiments, a height (h2) 272 of the second trench structure 204 is between about 50% and about 90% of the thickness (t1) 270 of the substrate 252. The second trench structure 204 is formed substantially adjacent to the first trench structure 206. In some embodiments, a middle region of the substrate 252 remains between the first trench structure 206 and the second trench structure 204. The second trench structure 204 extends from a top surface of the substrate 252 into a second region of the substrate 252, such that a substrate portion 266 remains between a bottom surface of the second trench structure 204 and a bottom surface of the silicon substrate 252. In an example, a top surface of the first trench structure 206 extends above a bottom surface of the second trench structure 204. That is, the second trench structure 204 is formed to a depth below the top surface of the first trench structure 206. In this way, the process-induced charge 264 can be released from the integrated circuitry 202 by traveling through the substrate portion 266, a middle region of the substrate 252 between the first trench structure 206 and the second trench structure 204, and the substrate portion 268, as illustrated in example 250 of FIG. 2B.

At 108, the second trench structure 204 is filled with a second fill material, such as a dielectric material. In some embodiments, the second fill material is the same as the fill material used in the first trench structure 206. In some embodiments, the second fill material is different than the fill material used in the first trench structure 206. In some embodiments, the fill material comprises ambient air or oxygen such that no additional material is formed in the second trench structure 204. That is, although second trench 'structure' 204 is used herein, such a 'structure' comprises an opening in the substrate 252 in some embodiments. As with the first trench structure 206, an interface between the fill material of the second trench structure 204 and the substrate 252 is capable of blocking or redirecting stress energy 260 away from the integrated circuitry 202 (stress energy redirection 260a), as illustrated in example 250 of FIG. 2B. This remains true where second trench structure 204 is filled with ambient air and thus comprises an opening in the substrate 252. In some embodiments, the support structure comprises one or more additional trench structures, not illustrated.

In some embodiments, the support structure is formed substantially around a periphery of the integrated circuitry 202, as illustrated in example 200 of FIG. 2A. In an example, the first trench structure 206 is formed as a first ring around the integrated circuitry 202. It will be appreciated that 'ring' as used herein is not limited to circular, but includes other shapes as well, such as elliptical, rectangular, etc. The second trench structure 204 is formed as a second ring around the integrated circuitry 202. The first ring is concentric with the second ring. In an example, the first trench structure 206, the second trench structure 204, and a portion of the substrate between the first trench structure 206 and the second trench structure 204 are formed as a seal-ring between the integrated circuitry 202 and the second integrated circuitry 210.

In some embodiments, the integrated circuitry 202 comprises an image sensor. The image sensor comprises a pixel array, a black level calibration region, and/or a pad. In some embodiments, an antireflective coating 254 is formed over the substrate 252, such that light that is to be detected by the pixel array (e.g., photodiodes) is not reflected away. A buffer layer 256 is formed over the antireflective coating 254. A dielectric layer 258 is formed over the buffer layer 256. In this way, a partial etch of the substrate 252 is performed to form the support structure that can mitigate stress energy 260, 262 and/or facilitate the release of process-induced charge 264.

Figure 3:
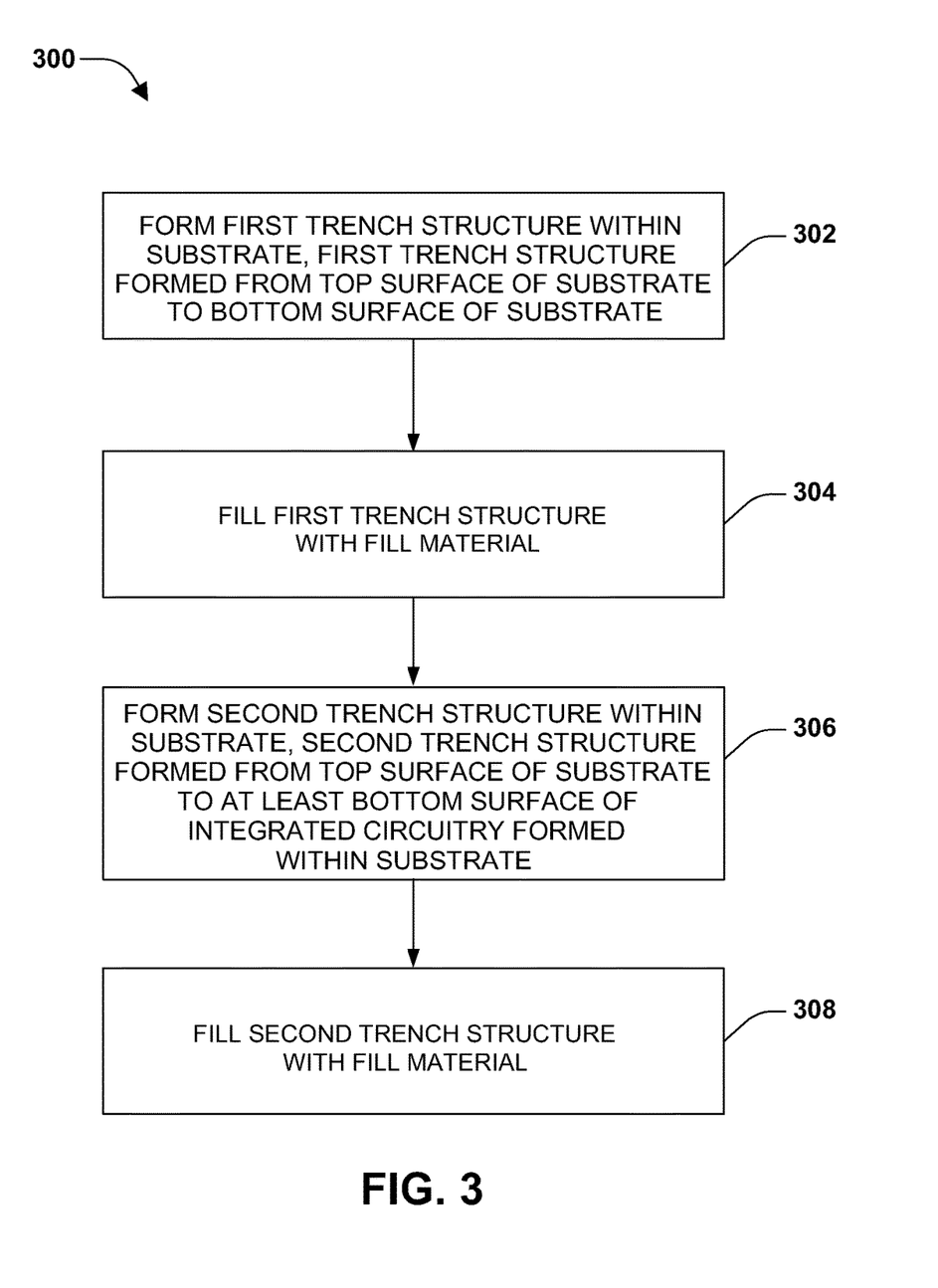
FIG. 3 is a flow diagram illustrating a method of forming a support structure for integrated circuitry, according to some embodiments.
Figure 4A:
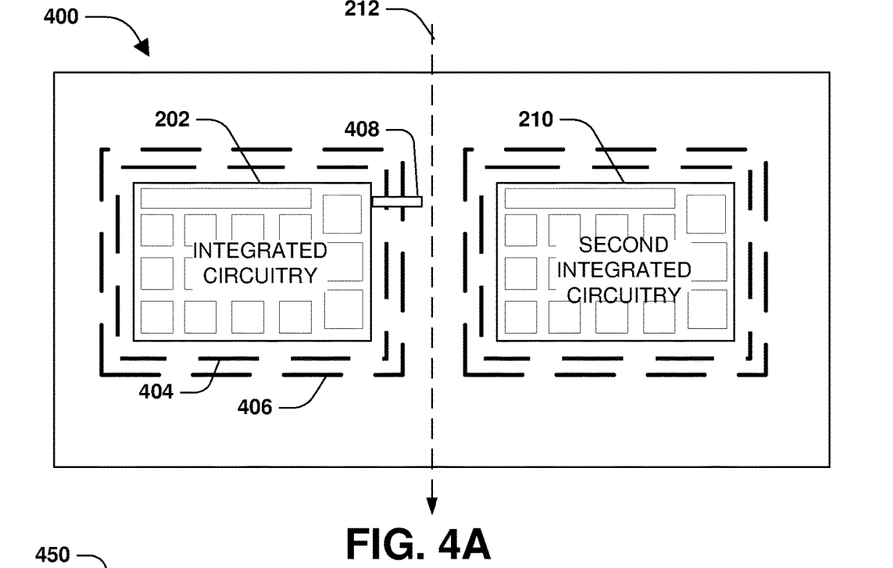
FIG. 4A is an illustration of a support structure, according to some embodiments.
Figure 4B:
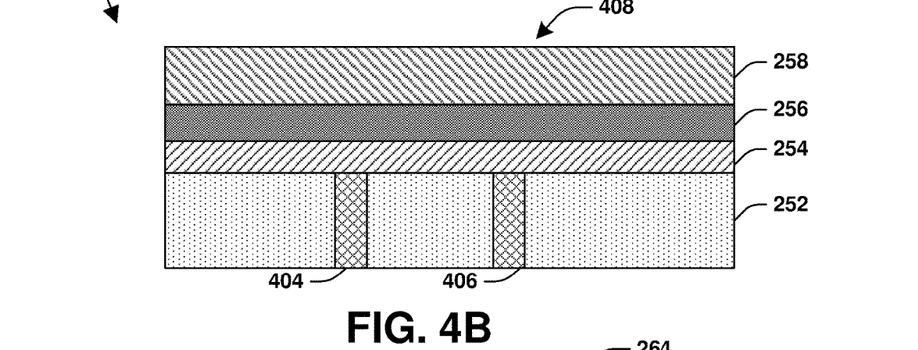
FIG. 4B is an illustration of a cross-sectional view of a support structure taken along line 408 of FIG. 4A, according to some embodiments.
Figure 4C:
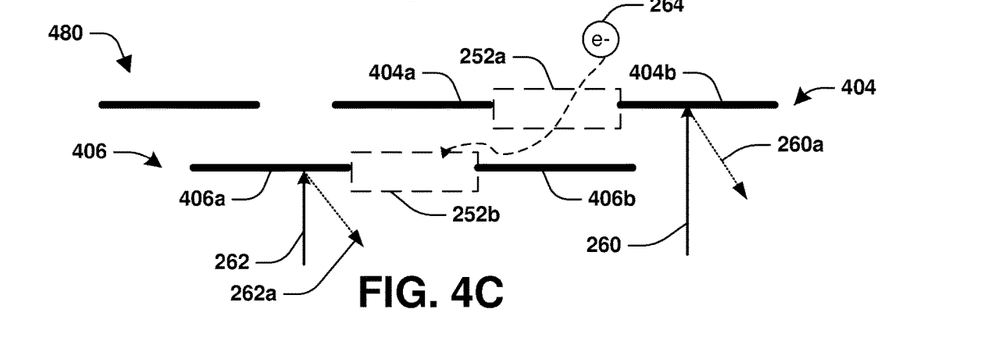
FIG. 4C is an illustration of a support structure, according to some embodiments.

A method 300 of forming a support structure for integrated circuitry 202, according to some embodiments, is illustrated in FIG. 3, and one or more support structures formed by such a methodology are illustrated in FIGS. 4A-4C. In an example, a semiconductor wafer comprises integrated circuitry 202 and second integrated circuitry 210, as illustrated in example 400 of FIG. 4A. A support structure comprising one or more trench structures, such as a first trench structure 406 and a second trench structure 404, is formed in order to mitigate stress (e.g., stress energy 262 and stress energy 260) on the integrated circuitry 202, such as due to a dicing process 212 that separates the integrated circuitry 202 from the second integrated circuitry 210. The support structure is formed such that process-induced charge 264 is capable of releasing from the integrated circuitry 202 through a remaining portion of a substrate 252 within which the support structure is formed, as illustrated in example 480 of FIG. 4C.

At 302, the first trench structure 406 is formed within the substrate 252. In some embodiments, a scribe line etching process is utilized to form the first trench structure 406. In some embodiments, a width of the first trench structure 406 is between about 5 μm and about 200 μm, as measured across the page. In some embodiments, the first trench structure 406 is formed from a top surface of the substrate 252 to a bottom surface of the substrate, as illustrated by example 450 of FIG. 4B corresponding to cross-sectional view taken along line 408 of FIG. 4A. The first trench structure 406 comprises one or more trench portions separate by separation regions of the substrate 252. For example, the first trench structure 406 comprises a first trench portion 406a and a second trench portion 406b. The first trench portion 406a is separated from the second trench portion 406b by a separation region 252b of the substrate 252. In some embodiments, the first trench portion 406a and the second trench portion 406b have the same or different depths. In some embodiments, the first trench portion 406a and the second trench portion 406b have the same or different lengths. In this way, the process-induced charge 264 can be released from the integrated circuitry 202 by traveling through one or more separation regions, as illustrated in example 480 of FIG. 4C. At 304, the first trench structure 406 is filled with a fill material that is different than a material of the substrate 252. In some embodiments, the fill material comprises ambient air or oxygen such that no additional material is formed in the first trench structure 206. That is, although first trench 'structure' 406 is used herein, such a 'structure' comprises an opening in the substrate 252 in some embodiments. An interface between the fill material of the first trench structure 406 and the substrate 252 is capable of blocking or redirecting stress energy 262 away from the integrated circuitry 202 (stress energy redirection 262a), as illustrated in example 480 of FIG. 4C.

At 306, a second trench structure 404 is formed within the substrate 252 of the semiconductor wafer. In some embodiments, a scribe line etching process is utilized to form the second trench structure 406. In some embodiments, a width of the second trench structure 406 is between about 5 μm and about 200 μm, as measured across the page. In some embodiments, the second trench structure 406 is formed from the top surface of the substrate 252 to the bottom surface of the substrate, as illustrated by example 450 of FIG. 4B. The second trench structure 406 comprises one or more trench portions separate by separation regions of the substrate 252. For example, second first trench structure 404 comprises a first trench portion 404a and a second trench portion 404b. The first trench portion 404a is separated from the second trench portion 404b by a separation region 252a of the substrate 252. In some embodiments, the first trench portion 404a and the second trench portion 404b have the same or different depths. In some embodiments, the first trench portion 404a and the second trench portion 404b have the same or different lengths. In this way, the process-induced charge 264 can be released from the integrated circuitry 202 by traveling through one or more separation regions such as the separation region 252a and the separation region 252b, as illustrated in example 480 of FIG. 4C. At 308, the second trench structure 404 is filled with a second fill material. In some embodiments, the second fill material is the same as the fill material used in the first trench structure 206. In some embodiments, the second fill material is different than the fill material used in the first trench structure 206. In some embodiments, the fill material comprises ambient air or oxygen such that no additional material is formed in the second trench structure 204. That is, although second trench 'structure' 204 is used herein, such a 'structure' comprises an opening in the substrate 252 in some embodiments. As with the first trench structure 206, an interface between the fill material of the second trench structure 404 and the substrate 252 is capable of blocking or redirecting stress energy 260 away from the integrated circuitry 202 (stress energy redirection 260a), as illustrated in example 480 of FIG. 4C. This remains true where second trench structure 204 is filled with ambient air and thus comprises an opening in the substrate 252. In some embodiments, the first trench portion 406a of the first trench structure 406 is offset from the first trench portion 404a of the second trench structure 404.

In some embodiments, the integrated circuitry 202 comprises an image sensor. The image sensor comprises a pixel array, a black level calibration region, and/or a pad. In some embodiments, an antireflective coating 254 is formed over the substrate 252, as illustrated by example 450 of FIG. 4B. A buffer layer 256 is formed over the antireflective coating 254. A dielectric layer 258 is formed over the buffer layer 256. In this way, a discontinued etch of the substrate 252 is performed to form the support structure that can mitigate stress energy 260, 262 and/or facilitate the release of process-induced charge 264.

Figure 4D:
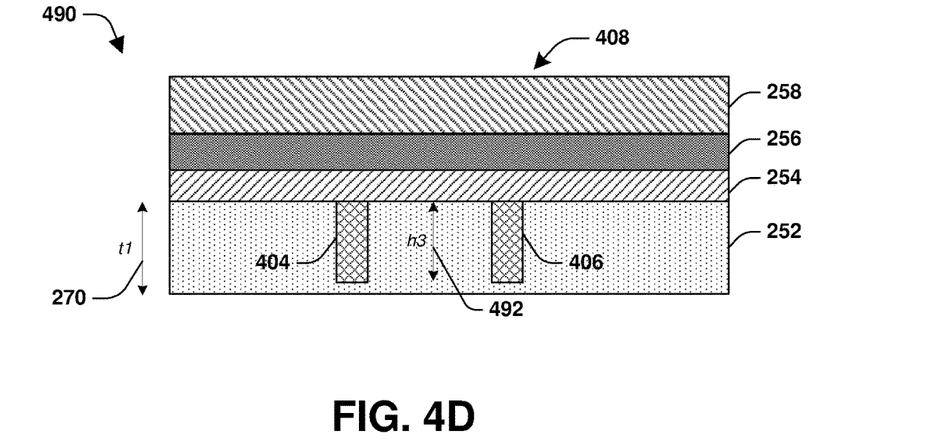
FIG. 4D is an illustration of a support structure, according to some embodiments.

In some embodiments, the support structure is formed such that a height (h3) 492 of the first trench structure 404 and the second trench structure 406 is less than a thickness (t1) 270 of the substrate 252, as illustrated by example 490 of FIG. 4D. For example, the first trench structure 404 and the second trench structure 406 are formed at least to a depth corresponding to a bottom surface of integrated circuitry 202, where the bottom surface of the integrated circuitry 202 is above a bottom surface of the substrate 252.

Figure 5:
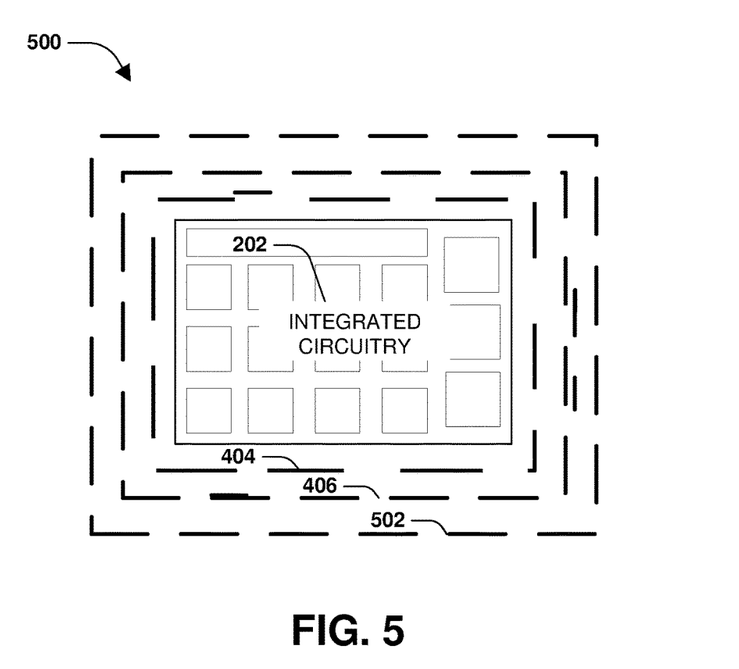
FIG. 5 is an illustration of a support structure, according to some embodiments.

In some embodiments, the support structure comprises one or more additional trench structures. That is, any number of trench structures can be formed within the substrate 252. For example, a third trench structure 502 can be formed within the substrate 252, as illustrated by example 500 FIG. 5. The third trench structure 502 can aid in blocking or redirecting stress energy away from integrated circuitry.

According to an aspect of the instant disclosure, a support structure for integrated circuitry is disclosed. The support structure comprises a first trench structure formed within a substrate. The first trench structure comprises a fill material that is different than a material of the substrate. The support structure comprises a second trench structure formed within the substrate substantially adjacent to the first trench structure. The second trench structure comprises a second fill material.

According to an aspect of the instant disclosure, a method for forming a support structure is provided. The method comprises forming a first trench structure within a substrate. The first trench structure is formed from a top surface of the substrate to a bottom surface of the substrate. The first trench structure is filled with a fill material different than a material of the substrate. A second trench structure is formed within the substrate. The second trench structure is formed from the top surface of the substrate to the bottom surface of the substrate. The second trench structure is filled with a second fill material.

According to an aspect of the instant disclosure, a method for forming a support structure is provided. The method comprises forming a first trench structure within a substrate.

The first trench structure extends from a bottom surface of the substrate into a region of the substrate. The first trench structure is filled with a fill material that is different than a material of the substrate. A second trench structure is formed within the substrate. The second trench structure extends from a top surface of the substrate into a second region of the substrate. The second trench structure is filled with a second fill material.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims.

What is claimed is:

1. A support structure for an integrated circuit, comprising:
   a first trench structure formed within a substrate and comprising a first non-gaseous fill material, wherein:
      the substrate has a first thickness and the first trench structure has a second thickness less than the first thickness, and
      a top surface of the first trench structure is co-planar with a top surface of the substrate;
   a second trench structure formed within the substrate and comprising a second non-gaseous fill material, wherein:
      the second trench structure has a third thickness less than the first thickness, and
      a bottom surface of the second trench structure is co-planar with a bottom surface of the substrate; and
   an anti-reflective coating overlying the first trench structure and the second trench structure.

2. The support structure of claim 1, wherein the support structure is formed along a periphery of the integrated circuit.

3. The support structure of claim 1, wherein the anti-reflective coating is in contact with a top surface of the first trench structure.

4. The support structure of claim 1, wherein the first non-gaseous fill material and the second non-gaseous fill material are a same material.

5. The support structure of claim 1, wherein:
   the first trench structure is formed as a first ring around the integrated circuit,
   the second trench structure is formed as a second ring around the integrated circuit, and
   the first ring is concentric with the second ring.

6. The support structure of claim 1, wherein the substrate comprises a middle region between the first trench structure and the second trench structure.

7. The support structure of claim 1, wherein the second thickness is equal to the third thickness.

8. The support structure of claim 1, comprising a dielectric layer overlying the anti-reflective coating.

9. The support structure of claim 8, comprising a buffer layer between the anti-reflective coating and the dielectric layer.

10. The support structure of claim 1, wherein a non-linear pathway is defined in the substrate that extends under the first trench structure and over the second trench structure.

11. The support structure of claim 1, wherein the anti-reflective coating is spaced apart from a top surface of the second trench structure.

12. A support structure for an integrated circuit, comprising:
   a first trench structure defining a first segmented ring and formed within a substrate, wherein:
      the first trench structure comprises a first non-gaseous fill material,
      the first trench structure surrounds the integrated circuit, and
      a top surface of the first trench structure is co-planar with a top surface of the substrate; and
   a second trench structure defining a second segmented ring and formed within the substrate, wherein:
      the second trench structure comprises a second non-gaseous fill material,
      the second trench structure surrounds the integrated circuit, the second segmented ring is concentric with the first segmented ring, and a bottom surface of the second trench structure is co-planar with a bottom surface of the substrate.

13. The support structure of claim 12, wherein:

the substrate has a first thickness, and the first trench structure has a second thickness less than the first thickness.

14. The support structure of claim 12, wherein the first trench structure and the second trench structure extend through the substrate.

15. The support structure of claim 12, wherein a first segment of the first segmented ring is separated from a second segment of the first segmented ring by a portion of the substrate.

16. The support structure of claim 15, wherein a first segment of the second segmented ring overlaps the portion of the substrate, the first segment of the first segmented ring, and the second segment of the first segmented ring.

17. The support structure of claim 12, wherein at least one of the first non-gaseous fill material or the second non-gaseous fill material is a dielectric material.

18. A support structure for an integrated circuit, comprising:

a first trench structure formed within a substrate and comprising a first non-gaseous fill material, wherein:

the substrate has a first thickness and the first trench structure has a second thickness less than the first thickness, and a top surface of the first trench structure is co-planar with a top surface of the substrate; and a second trench structure formed within the substrate and comprising a second non-gaseous fill material, wherein:

the second trench structure has a third thickness less than the first thickness, and a bottom surface of the second trench structure is co-planar with a bottom surface of the substrate.

19. The support structure of claim 18, wherein the first non-gaseous fill material and the second non-gaseous fill material are a same material.

20. The support structure of claim 18, wherein the second thickness is equal to the third thickness.

* * * * *